(12) United States Patent
Arad

(10) Patent No.: US 7,562,367 B1
(45) Date of Patent: Jul. 14, 2009

(54) SORTED-TREE-BASED EVENT QUEUE FOR DISCRETE EVENT SIMULATORS

(75) Inventor: Nir Arad, Haifa (IL)

(73) Assignee: Marvell Israel (M.I.S.L.) Ltd., Yokneam (IL)

(*) Notice: Subject to any disclaimer, the term of this patent is extended or adjusted under 35 U.S.C. 154(b) by 991 days.

(21) Appl. No.: 10/411,838

(22) Filed: Apr. 11, 2003

(51) Int. Cl.
*G06F 9/54* (2006.01)
*G05B 19/18* (2006.01)

(52) U.S. Cl. ............................ 719/318; 700/7
(58) Field of Classification Search ................ 719/318; 709/102; 700/7
See application file for complete search history.

(56) References Cited

U.S. PATENT DOCUMENTS

| | | | | |
|---|---|---|---|---|
| 5,828,867 | A | | 10/1998 | Pannell |
| 5,850,538 | A | * | 12/1998 | Steinman ................ 703/21 |
| 6,006,027 | A | * | 12/1999 | Downey ................ 703/17 |
| 6,208,954 | B1 | | 3/2001 | Houtchens |
| 6,278,963 | B1 | | 8/2001 | Cohen |
| 6,324,495 | B1 | * | 11/2001 | Steinman ................ 703/17 |
| 6,597,957 | B1 | * | 7/2003 | Beakley ................ 700/7 |
| 2002/0107677 | A1 | | 8/2002 | Nguyen et al. |

FOREIGN PATENT DOCUMENTS

EP    1 158 741 A2    11/2001

OTHER PUBLICATIONS

Jha et al., Simultaneous events and lookahead in simulation protocols, ACM Transactions on Modeling and Computer Simulation (TOMACS), vol. 10, Issue 3 (Jul. 2000), pp. 241-267.*
Brown et al., Issues in the design of a logic simulator: an improved caching technique for event-queue management, Circuits, Devices and Systems, IEE Proceedings, vol. 142, Issue 5, Oct. 1995 pp. 293-298.*
Brown et al., Issues in the desi.gn of a lo,qic simulator: an improved caching technique for event-queue management, Circuits, Devices and Systems, IEE Proceedingvol. 142, Issue 5, Oct. 1995 pp. 293-298.*

* cited by examiner

*Primary Examiner*—Meng-Ai An
*Assistant Examiner*—Abdou K Seye (57) ABSTRACT

A method, apparatus, and computer-readable media for managing an event queue for a simulation comprising a plurality of events each scheduled to occur at one of a plurality of event times comprises generating a sorted tree data structure comprising a plurality of nodes, wherein each of the nodes in the sorted tree data structure corresponds to only one of the event times, and wherein the nodes of the sorted tree data structure are sorted according to the event times of the nodes; generating an event record for each event; and associating the event records with the nodes so that each of the event records is associated with the node corresponding to the event time at which the respective event is scheduled to occur.

16 Claims, 10 Drawing Sheets

SORTED-TREE-BASED EVENT QUEUE FOR DISCRETE EVENT SIMULATORS

BACKGROUND

The present invention relates generally to event simulation. More particularly, the present invention relates to maintaining and managing an event queue comprising multiple events.

Before a new electronic circuit design is put into mass production, it must be tested. One way to test the design is to fabricate a device according to the design, and then to test the device. However, this approach consumes significant time, effort and money. Consequently, it has become increasingly popular to simulate the circuit in software before fabricating a device. A similar approach is taken with regard to design of networks and other complex systems.

Such a simulation is generally arranged as a time-ordered collection of discrete events, referred to as an "event queue." Each event in the event queue represents a change in the simulated system, such as a change in the state of a signal within a circuit. During the simulation, events can be added to the event queue to represent further changes within the system. Once the simulation time reaches the event time that was set for a particular event, and the simulation software executes the changes resulting from this event, the event is removed from the event queue.

Event queues are commonly simulated by creating data structures that are operated upon by software running on a computer. One conventional implementation, the "common event queue" commonly used in open-source kernels, is implemented as a linked list of items, ordered by time, where each item represents an event in the event queue. Advantages of the common event queue include simplicity and rapid removal of events from the event queue. However, a significant disadvantage of the common event queue is slow insertion of new events into the event queue.

SUMMARY

In general, in one aspect, the invention features an apparatus for managing an event queue for a simulation comprising a plurality of events each scheduled to occur at a respective event time, the apparatus comprising a tree generator adapted to generate a sorted tree data structure comprising a plurality of nodes, wherein each of the nodes in the sorted tree data structure corresponds to only one of the event times, and wherein the nodes of the sorted tree data structure are sorted according to the event times of the nodes; a record generator adapted to generate an event record for each event; and an association unit adapted to associate the event records with the nodes so that each of the event records is associated with the one of the nodes corresponding to the event time at which the respective event is scheduled to occur.

Particular implementations can include one or more of the following features. The sorted tree data structure is a binary sorted tree data structure. One of the nodes is associated with a plurality of the event records, and, to associate the event records with the nodes, the association unit is further adapted to generate a linked list comprising the event records associated with the one of the nodes; and associate the linked list with the one of the nodes. The record generator is further adapted to generate a new event record for a new event; and the association unit is further adapted to associate the new event record with a node of the sorted tree data structure that corresponds to an event time at which the new event is scheduled to occur. The tree generator is further adapted to determine whether a node of the sorted tree data structure exists that corresponds to the event time at which the new event is scheduled to occur; and generate the node corresponding to the event time at which the new event is scheduled to occur when no node exists that corresponds to the event time at which the new event is scheduled to occur. The association unit, when no node exists that corresponds to the event time at which the new event is scheduled to occur, is further adapted to generate a linked list comprising the new event record; and associate the linked list with the node corresponding to the event time at which the new event is scheduled to occur. Implementations comprise an execution unit adapted to execute the simulation, wherein the execution unit is further adapted to delete an event record for one of the events; and simulate the one of the events. The execution unit, to execute the simulation, is further adapted to delete the node that corresponds to the event time at which the one of the events is scheduled to occur when no others of the events are scheduled to occur at that event time.

In general, in one aspect, the invention features a method, apparatus, and computer-readable media for managing an event queue for a simulation comprising a plurality of events each scheduled to occur at one of a plurality of event times. It comprises generating a sorted tree data structure comprising a plurality of nodes, wherein each of the nodes in the sorted tree data structure corresponds to only one of the event times, and wherein the nodes of the sorted tree data structure are sorted according to the event times of the nodes; generating an event record for each event; and associating the event records with the nodes so that each of the event records is associated with the node corresponding to the event time at which the respective event is scheduled to occur.

Particular implementations can include one or more of the following features. The sorted tree data structure is a binary sorted tree data structure. One of the nodes is associated with a plurality of the event records, and associating the event records with the nodes comprises generating a linked list comprising the event records associated with the one of the nodes; and associating the linked list with the one of the nodes. Implementations comprise adding a new event to the event queue, comprising generating a new event record for the new event; and associating the new event record with a node of the sorted tree data structure that corresponds to a event time at which the new event is scheduled to occur. Implementations comprise determining whether a node of the sorted tree data structure exists that corresponds to the event time at which the new event is scheduled to occur; and generating the node corresponding to the event time at which the new event is scheduled to occur when no node exists that corresponds to the event time at which the new event is scheduled to occur. Implementations comprise, when no node exists that corresponds to the event time at which the new event is scheduled to occur, generating a linked list comprising the new event record; and associating the linked list with the node corresponding to the event time at which the new event is scheduled to occur. Implementations comprise executing the simulation, comprising deleting the event record for one of the events; and simulating the one of the events. Executing the simulation further comprises deleting the node that corresponds to the event time slot at which the one of the events is scheduled to occur when no others of the events are scheduled to occur at that event time.

The details of one or more implementations are set forth in the accompanying drawings and the description below. Other features will be apparent from the description and drawings, and from the claims.

DESCRIPTION OF DRAWINGS

The leading digit(s) of each reference numeral used in this specification indicates the number of the drawing in which the reference numeral first appears.

DETAILED DESCRIPTION

Embodiments of the present invention can represent and simulate any number of types of devices and processes, both inside and outside the field of electronic circuits. Before describing a preferred embodiment of the present invention, an example of an event queue simulation is described.

FIGS. 1A through 1F show an event queue 100 for a simulation. Event queue 100 has a timeline having 10 possible event times t=1 through t=10. Each event time represents a different point in time during the timeline of the simulation. While, for ease of explanation, embodiments of the present invention are discussed with reference to a timeline 100 having a finite set of possible event times, embodiments of the invention apply equally well to a simulation timeline having an infinite number of possible event times, such that an event can be scheduled at any time during the simulation, as will be apparent to one skilled in the relevant arts after reading this description. Referring again to FIG. 1, each event is assigned to one of the event times. During execution of the simulation, the simulation time advances along the timeline according to the event times of the events in event queue 100. When the simulation time reaches an event time for which an event is scheduled to occur, all of the events associated with that event time are simulated. When all of the events associated with an event time have been simulated, the simulation time advances to the next event time having associated events.

Figure 1A:
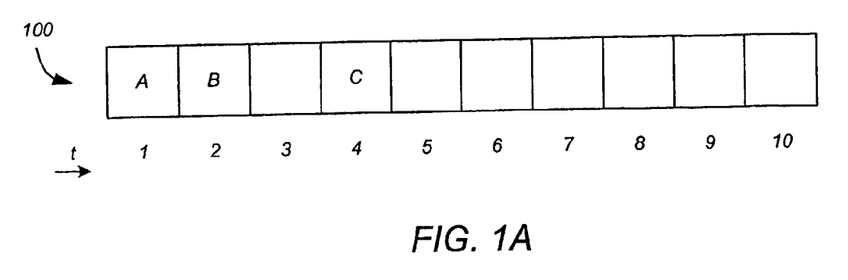
FIGS. 1A through 1F show an event queue for a simulation.

Referring to FIG. 1A, event queue 100 initially comprises three events A, B, and C, which have event times t=1, t=2, and t=4, respectively. The simulation begins at simulation time t=1. Event A has event time t=1, and so is simulated at simulation time t=1. As each event is simulated, it is deleted from the event queue.

Figure 1B:
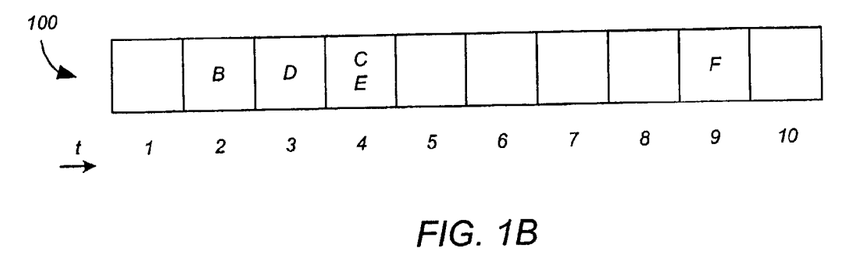

The simulation of an event can cause the creation of one or more new events. FIG. 1B shows the state of event queue 100 at simulation time t=2. Referring to FIG. 1B, the simulation of event A has caused the insertion of new events D, E, and F having event times t=3, t=4, and t=9, respectively. For example, event A could be a transition in the state of a signal applied to the input of an inverter, and event D could be the consequent signal transition of the output of that inverter.

Figure 1C:
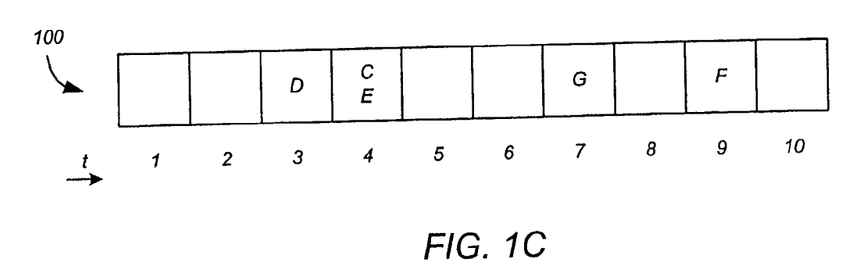
Figure 1D:
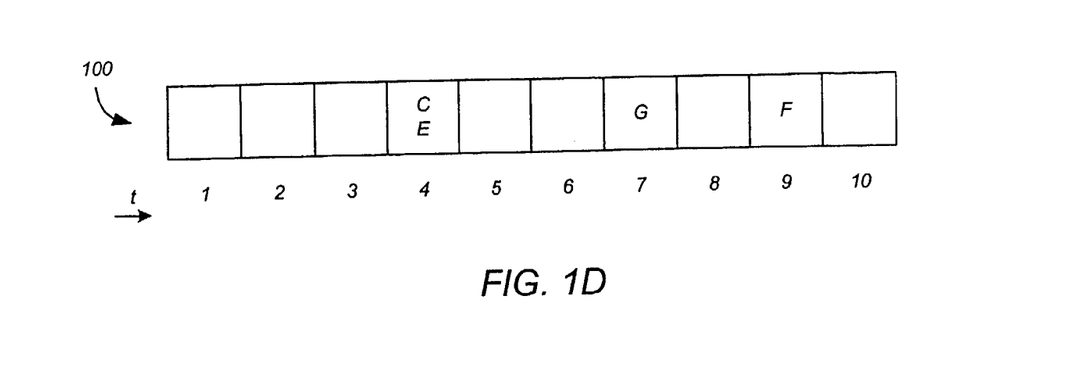

When the simulation time reaches time t=2, event B is simulated, which causes the insertion into the event queue of event G having event time t=7. FIG. 1C shows the state of event queue 100 at simulation time t=3. When the simulation time reaches time t=3, event D is simulated. FIG. 1D shows the state of event queue 100 at simulation time t=4.

Figure 1E:
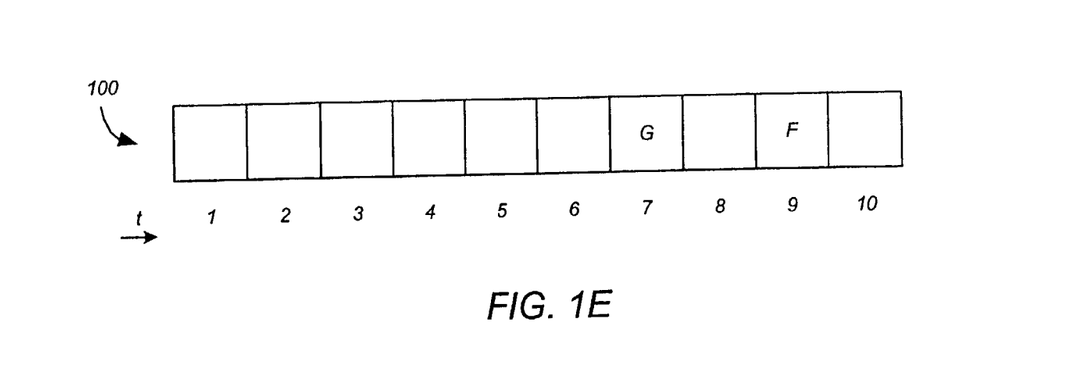

When the simulation time reaches time t=4, events C and E are simulated. Though having the same simulation time, events C and E are preferably executed sequentially by the simulation kernel. The simulation designer preferably exercises care not to assume a certain order among simultaneous events, as is well-known in the relevant arts. Nevertheless, in common implementations, as well as in the proposed method, events are preferably executed in the order in which they were inserted into event queue 100. Preferably, all events associated with an event time are simulated as though occurring simultaneously. FIG. 1E shows the state of event queue 100 at simulation time t=7.

Figure 1F:
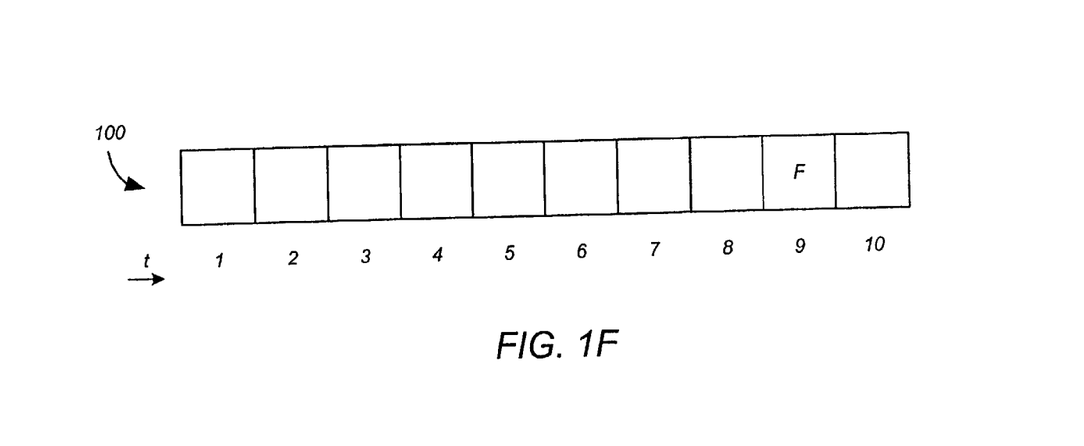

When the simulation time reaches time t=7, event G is simulated. FIG. 1F shows the state of event queue 100 at simulation time t=9. When the simulation time reaches time t=9, event F is simulated. After event F is simulated, event queue 100 is empty, and the simulation terminates.

Figure 2:
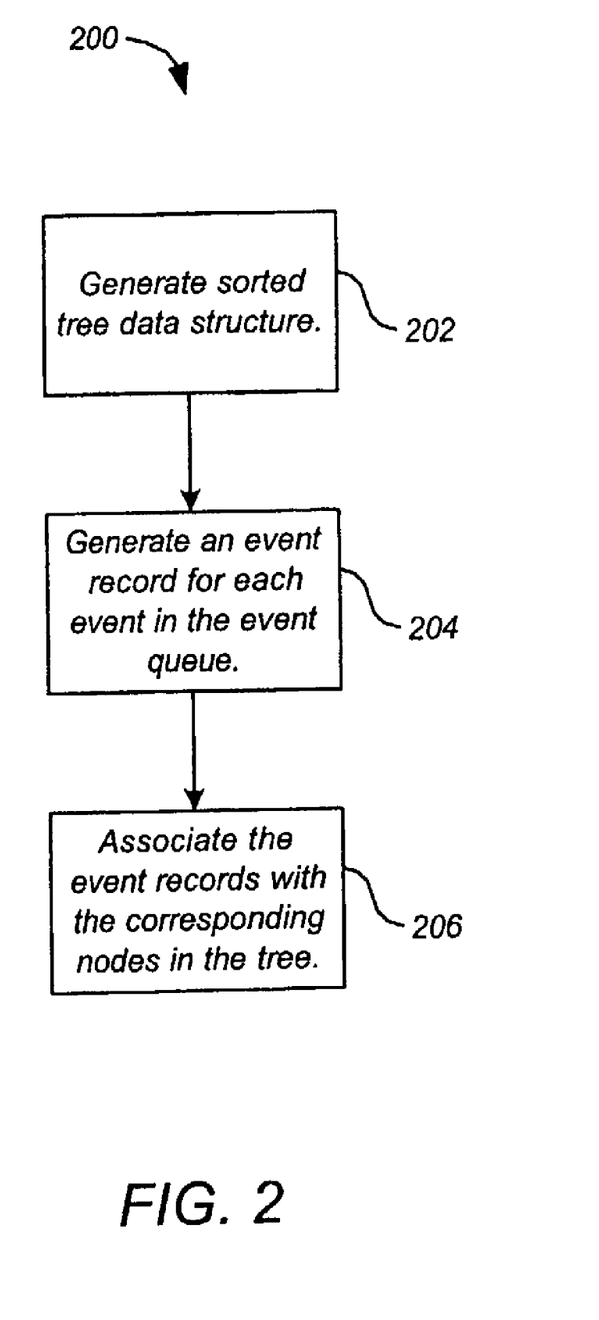
FIG. 2 shows a process for managing an event queue such as the event queue of FIG. 1.
Figure 6:
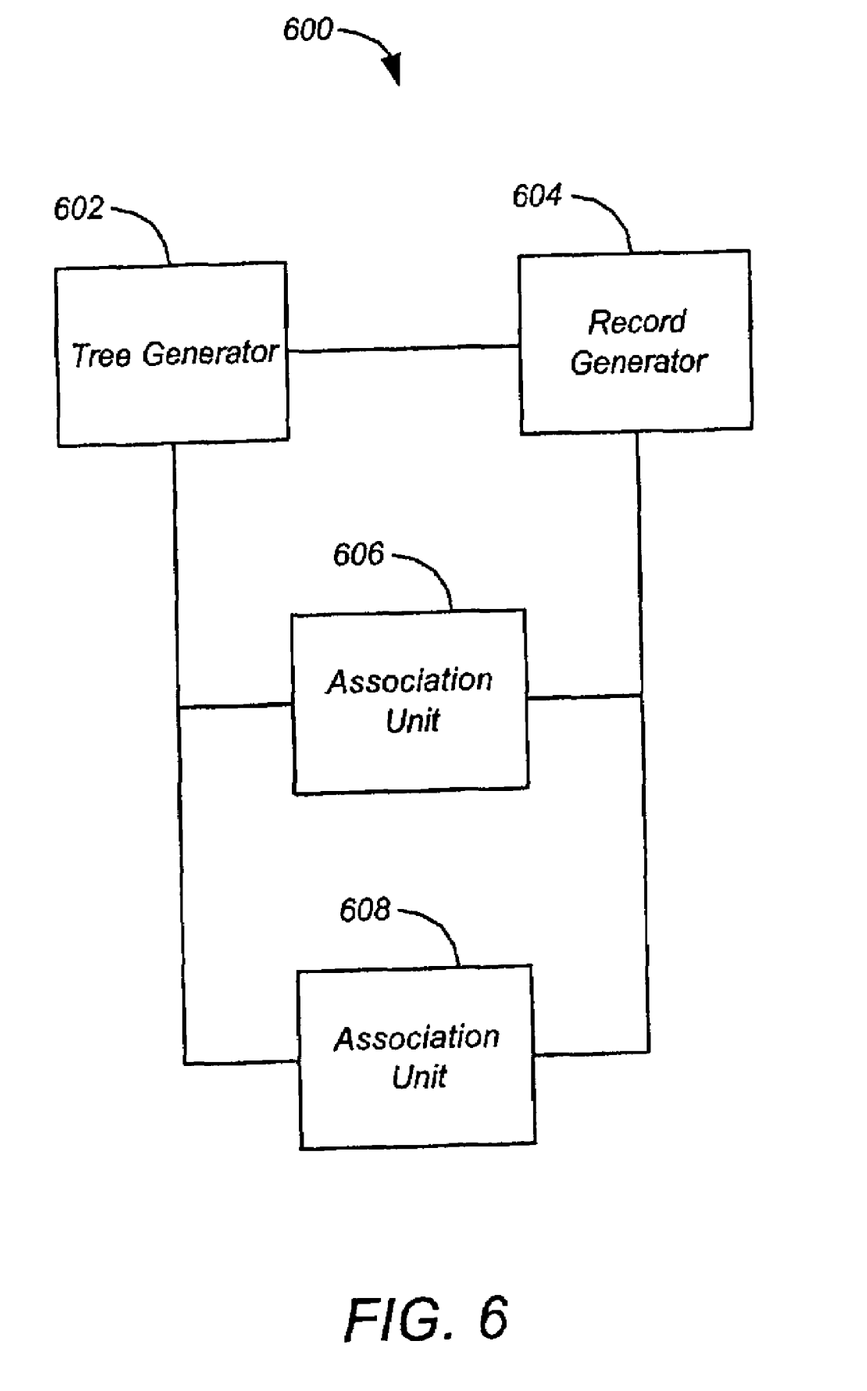
FIG. 6 shows an apparatus for executing the process of FIG. 2.

Now an apparatus, data structure, and process for managing an event queue are described. FIG. 2 shows a process 200 for managing an event queue such as event queue 100 of FIG. 1 according to a preferred embodiment. FIG. 6 shows an apparatus 600 for executing process 200. Of course, process 200 can be implemented in other ways, for example by a computer executing software. Process 200 generates a sorted tree data structure comprising a plurality of nodes (step 202). Referring to FIG. 6, the sorted data tree structure can be generated by tree generator 602. Each of the nodes in the sorted tree data structure corresponds to only one of the event times in the event queue. That is, each node represents only one point in time during the simulation timeline. In a preferred embodiment, the sorted tree data structure is a sorted binary tree. Preferably, each node contains two elements: a time-stamp representing the event time represented by the node, and a linked list of event records each representing an event in the simulation scheduled for the event time represented by the node.

Process 200 generates an event record for each event in the event queue (step 204). Referring to FIG. 6, the event records can be generated by record generator 604. Process 200 associates the event records with the nodes (step 206) so that each of the event records is associated with the node corresponding to the event time at which the that event is scheduled to occur. Referring to FIG. 6, the event records can be associated with the nodes by association unit 602. Preferably process 200 associates an event record with a node by inserting the event record in the linked list of the node.

Upon the generation of a new event, process 200 generates a new event record. If a node already exists in the tree for the event time of the new event, process 200 inserts the new event record at the end of the linked list of that node. If no node exists in the tree for the event time of the new event, process 200 creates a node for the event time of the new event, stores the event time as the time-stamp of the new node, and stores the event record as the first item in the linked list of the new node.

FIGS. 3A through 3G show a sorted binary tree data structure 300 for managing event queue 100 according to a preferred embodiment of the present invention. Although the sorted tree data structure discussed below and depicted in FIGS. 3A through 3F is binary, other orders of sorted trees are contemplated, such as sorted hex trees and the like. A sorted tree is simply a tree in which the nodes of the tree are sorted according to a value of each of the nodes. It is commonly implemented as a binary tree, in which the value of the left child node is smaller than the value of the parent node, and the value of the right child node is larger than the value of the parent node. In embodiments of the present invention, the value of each node represents the event time for that node.

Binary tree data structure 300 comprises a plurality of nodes 30$n$, each represented by a circle, and a plurality of event records 310, each represented by a square. Each node 30$n$ represents only one event time of the simulation. Each event record 310 represents one of the events A-G in event queue 100. Preferably, event records 310 that are associated with a node 30$n$ are grouped together as a linked-list. In a preferred embodiment, a node 30$n$ exists for an event time only when an existing event is associated with that event time. As the events associated with an event time are simulated, the event records 310 representing those events, and the node 30$n$ representing that event time, are deleted.

Figure 4:
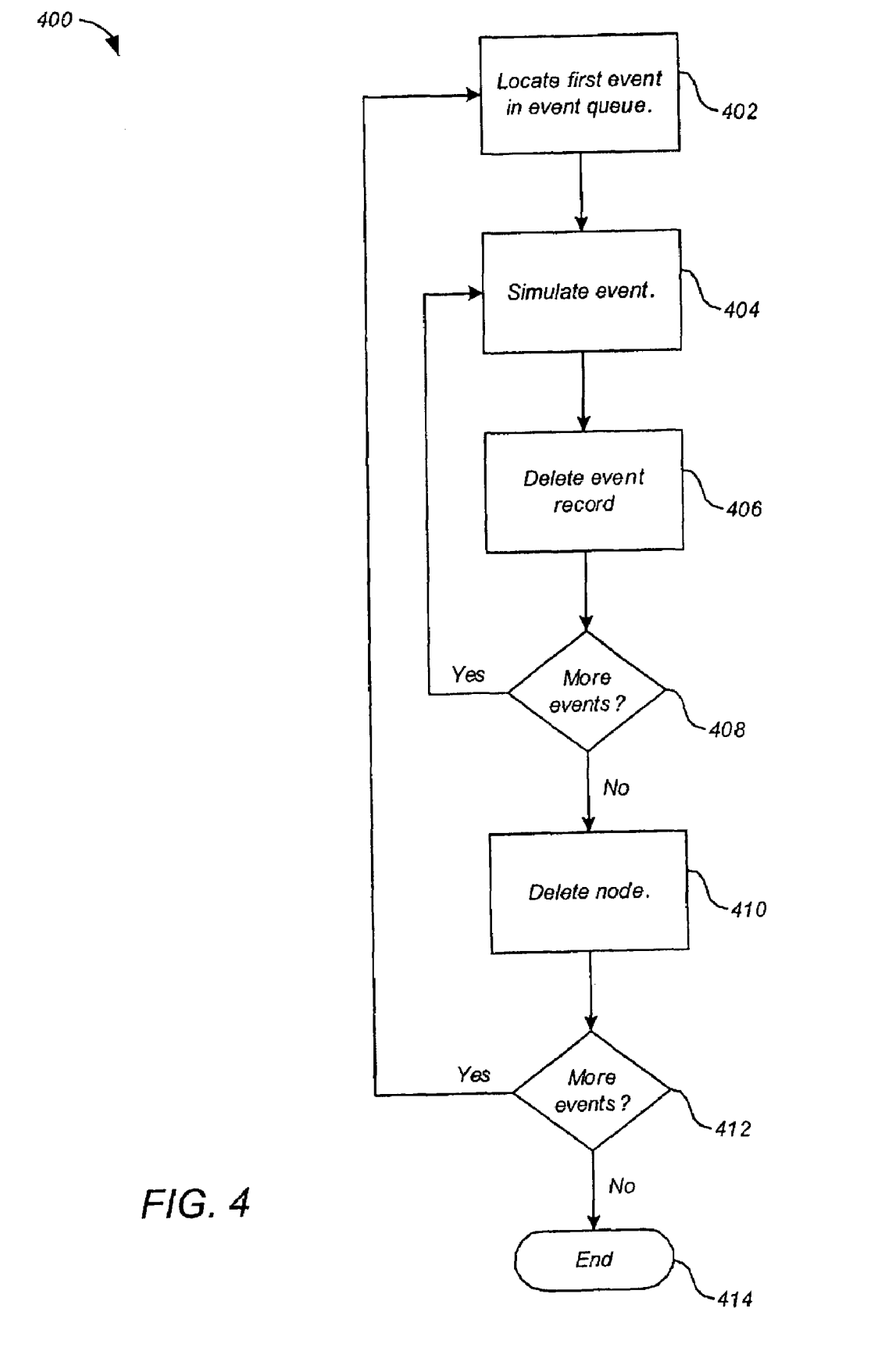
FIG. 4 shows a process for executing an event queue such as the event queue of FIG. 1 according to a preferred embodiment.

FIG. 4 shows a process 400 for executing a simulation such as that represented by event queue 100 of FIG. 1 according to a preferred embodiment. Referring to FIG. 6, the simulation can be executed by execution unit 608. Referring again to FIG. 4, process 400 locates the first event (that is, the event having the earliest event time) in event queue 100 (step 402). Process 400 then simulates that event (step 404). After simulating the event, process 400 deletes the event record for the event (step 406). If an event remains that is associated with that event time (step 408), process 400 simulates those events and deletes their event records (steps 404 and 406). When no events remain associated with that event time (step 408), process 400 deletes the node associated with that event time (step 410). If any events remain in the event queue (step 412), process 400 repeats steps 402 through 410. Otherwise process 400 ends (step 414).

Figure 3A:
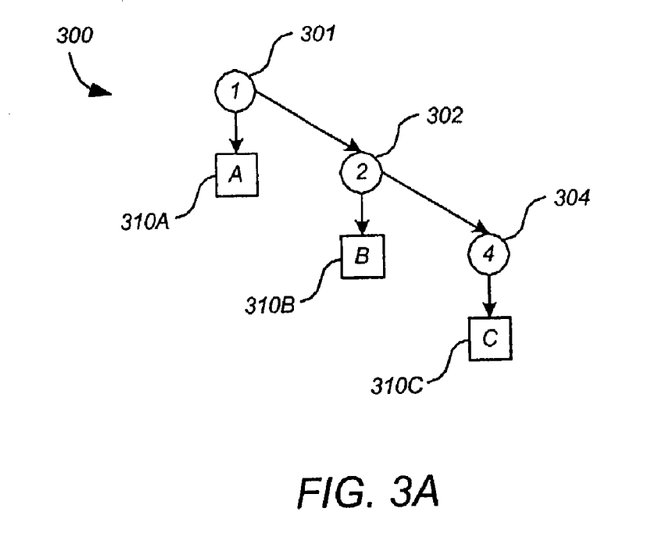
FIGS. 3A through 3G show a sorted binary tree data structure for managing the event queue of FIG. 1 according to a preferred embodiment of the present invention.

In a preferred embodiment, nodes 30$n$ and event records 310 are implemented using the Standard Template Library (STL), which is a part of the C++ Language Standard. Preferably nodes 30$n$ are implemented using the STL "map" container. Preferably linked-lists of event records 310 are implemented using the STL "list" container. Of course, nodes 30$n$ and event records 310 can be implemented in other ways, as long as those implementations support sorted insertion (that is, the insertion of a new node such that the tree remains sorted), ordered deletion (that is, the deletion of the first node in the tree), and lookup (that is, the ability to find a node in the tree according to its key).

Referring to FIG. 3A, which corresponds to simulation time t=1, tree 300 comprises nodes 301, 302, and 304, which correspond to event times t=1, t=2, and t=4, respectively. An event record 310 is associated with each of nodes 301, 302, and 304. In particular, event records 310A, 310B, and 310C, which correspond to events A, B, and C, are associated with nodes 301, 302, and 304, respectively.

At simulation time t=1, event A is simulated. Therefore, event record 310A, which represents event A, is deleted from tree 300.

In a preferred embodiment, each event record is an item in a list associated with the node representing the event time for which the event represented by that event record is scheduled. Further, an event can schedule a new event to the same event time.

After event record 310A is deleted, no event records remain associated with node 301. Therefore node 301 is deleted. As described above with reference to FIG. 1, the simulation of event A caused the creation of events D, E, and F, which have event times t=3, t=4, and t=9, respectively. Corresponding event records 310D, 310E, and 310F are created.

Figure 3B:
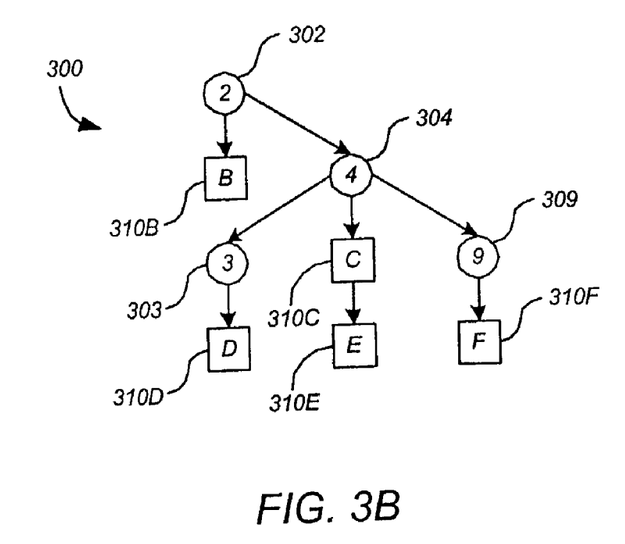

FIG. 3B shows binary tree 300 at simulation time t=2. Event record 310A is deleted. Therefore node 301 is also deleted. New events D and F are scheduled to occur at event times that are not represented within tree 300. Therefore, in accordance with well-known rules for node insertion in a sorted binary tree, a node 303 representing event time t=3 is inserted as the left child of node 304, and a node 309 representing event time t=9 is inserted as the right child of node 304.

Event record 310E is associated with node 304. Node 304 is now associated with multiple event records 310. Preferably, event records 310C and 310E are created as elements of a list that is associated with node 304. Event record 310D representing new event D is associated with node 303. Event record 310F representing new event F is associated with node 309.

Figure 3C:
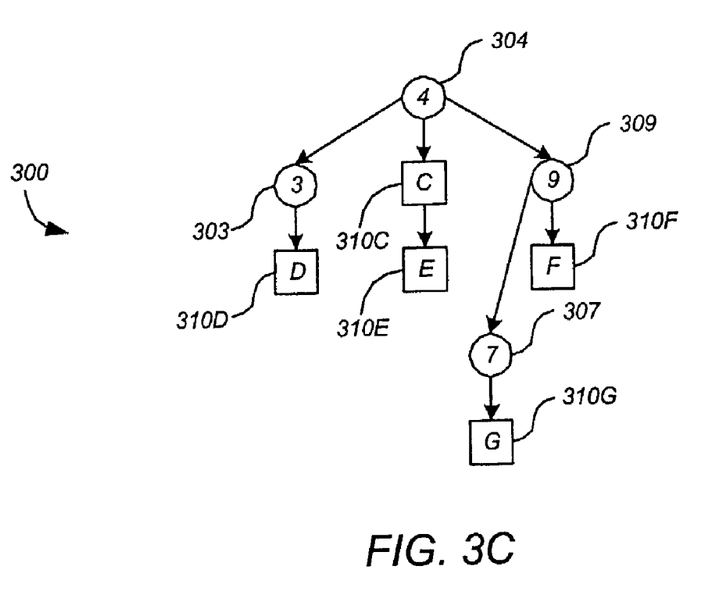

FIG. 3C shows binary tree 300 at simulation time t=3. Event B has been simulated, causing the deletion of event record 310B and node 302 from tree 300. New event G has been added to the event queue, causing a new event record 310G representing event G to be created. Because event G is scheduled to occur at event time t=7, an event time that is not represented within tree 300, a new node 307 representing event time t=7 is inserted as the left child of node 309, and is associated with event record 310G.

Figure 3D:
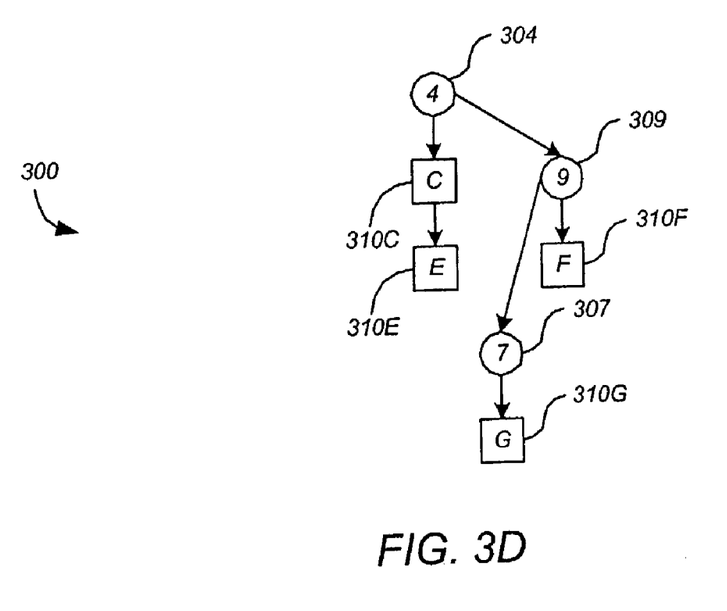

FIG. 3D shows binary tree 300 at simulation time t=4. Event D has been simulated, causing the deletion of event record 310D and node 303 from tree 300.

Figure 3E:
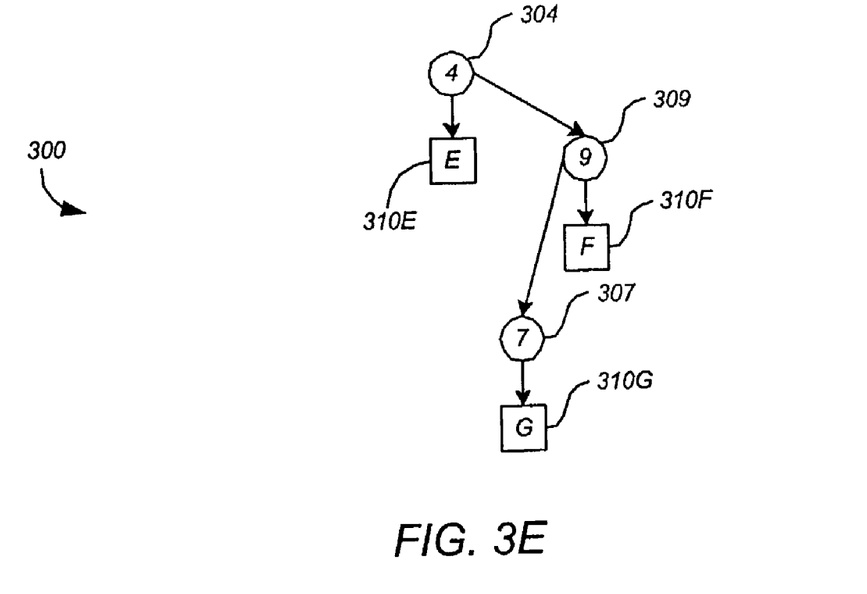

Multiple events (C and E) are scheduled for time t=4. In such a case, the events are preferably simulated in the same order in which they were added to the event queue. In addition, the simulation time is not advanced until all of the events for an event time have been simulated. First event C is simulated. FIG. 3E shows binary tree 300 at simulation time t=4, after the simulation of event C, but before the simulation of event E. Event C has been simulated, causing the deletion of event record 310C from tree 300.

Figure 3F:
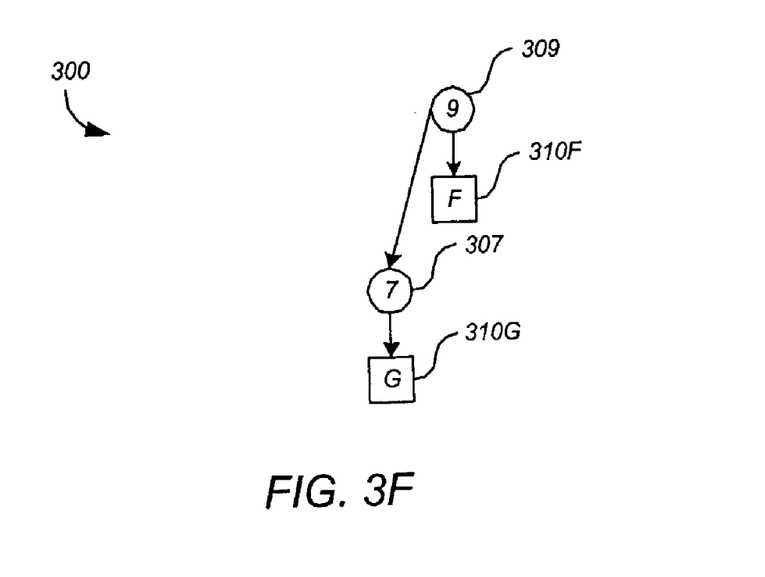

FIG. 3F shows binary tree 300 at simulation time t=7. Event E has been simulated, causing the deletion of event record 310E and node 304 from tree 300.

Figure 3G:
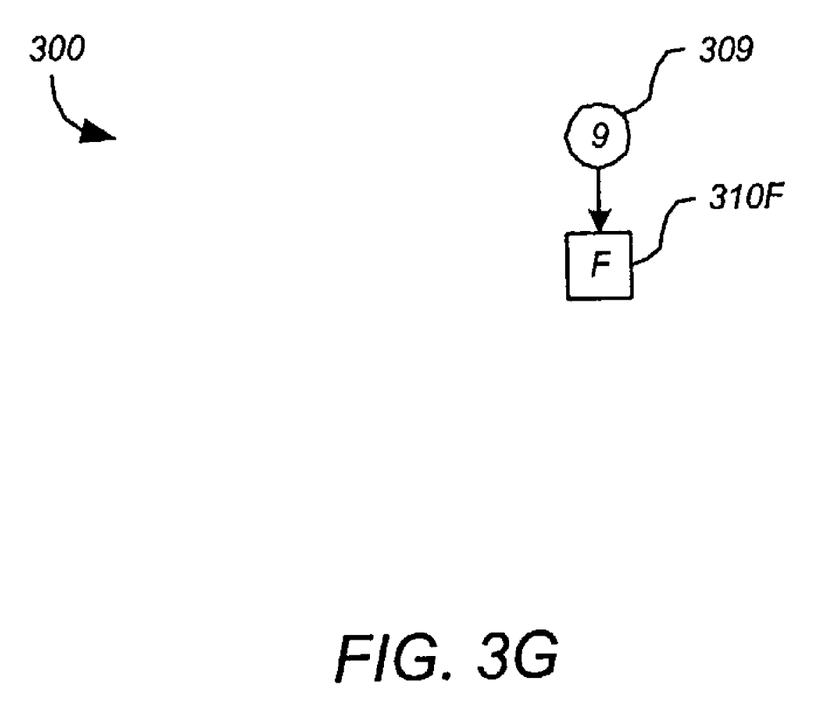

FIG. 3G shows binary tree 300 at simulation time t=9. Event G has been simulated, causing the deletion of node 307 and event record 310G from tree 300. At simulation time t=9, event F is simulated, causing the deletion of event record 310F and node 309 from tree 300.

Figure 5:
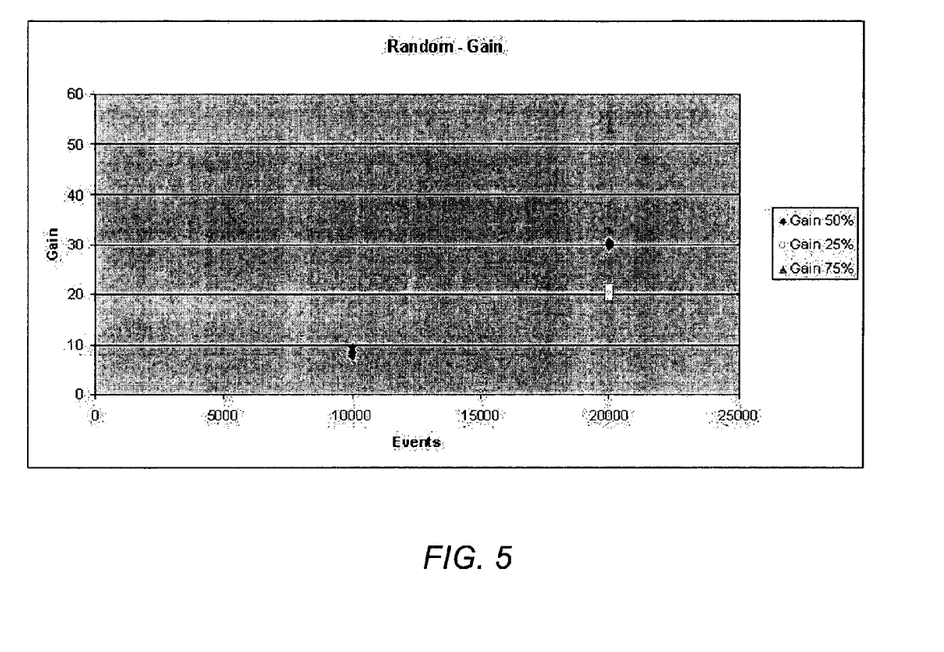
FIG. 5 shows the performance gain of an embodiment of the present invention as a function of the number of events simulated.

The performance gain achieved by a sorted binary tree embodiment of the present invention has been determined according to the following methodology. Models were written for a common event queue and for the event queue of the present invention. A scenario was generated in which the order of event insertions and deletions was random. This scenario was applied to both models, and the runtime of each model was measured using a profiler program. The results are shown in FIG. 5, which shows the performance gain as a function of the number of events simulated. Referring to FIG. 5, the performance gain was approximately 9 for 10,000 events, and ranged from approximately 20 to approximately 55 for 20,000 events, depending on the amount of events generated at the same simulation time (25%, 50%, 75%). Having many event happening at the same simulation time is very common in chip simulation, working at constant clock intervals, and in network simulations, where multicast packets are duplicated and sent across different ports at the same time. In those types of simulations, the performance gain is significantly larger.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. Accordingly, other implementations are within the scope of the following claims.

What is claimed is:

1. An apparatus having a processor for managing an event queue for a simulation comprising a plurality of events each scheduled to occur at a respective event time, the apparatus comprising:
   a tree generator adapted to generate a sorted tree data structure comprising a plurality of nodes, wherein each of the nodes in the sorted tree data structure corresponds to only one of the event times associated with the events scheduled to occur, and wherein the nodes of the sorted tree data structure are sorted according to the event times of the nodes;
   a record generator adapted to generate an event record for each event; and
   an association unit adapted to associate the event records with the nodes so that each of the event records is associated with the one of the nodes corresponding to the event time at which the respective event is scheduled to occur,
   wherein:
      the record generator is further adapted to generate a new event record for a new event; and
      the association unit is further adapted to associate the new event record with a node of the sorted tree data structure that corresponds to an event time at which the new event is scheduled to occur,
   wherein the tree generator is further adapted to:
      determine whether a node of the sorted tree data structure exists that corresponds to the event time at which the new event is scheduled to occur; and
      generate the node corresponding to the event time at which the new event is scheduled to occur when no node exists that corresponds to the event time at which the new event is scheduled to occur, and
      wherein the association unit, when no node exists that corresponds to the event time at which the new event is scheduled to occur, is further adapted to:
      generate a linked list comprising the new event record; and
      associate the linked list with the node corresponding to the event time at which the new event is scheduled to occur.

2. The apparatus of claim 1, wherein the sorted tree data structure is a binary sorted tree data structure.

3. The apparatus of claim 1, further comprising:
   an execution unit adapted to execute the simulation, wherein the execution unit is further adapted to
   delete an event record for one of the events; and
   simulate the one of the events.

4. The apparatus of claim 3, wherein the execution unit, to execute the simulation, is further adapted to:
   delete the node that corresponds to the event time at which the one of the events is scheduled to occur when no others of the events are scheduled to occur at that event time.

5. An apparatus having a processor for managing an event queue for a simulation comprising a plurality of events each scheduled to occur at a respective event time, the apparatus comprising:
   tree generator means for generating a sorted tree data structure comprising a plurality of nodes, wherein each of the nodes in the sorted tree data structure corresponds to only one of the event times associated with the events scheduled to occur, and wherein the nodes of the sorted tree data structure are sorted according to the event times of the nodes;
   record generator means for generating an event record for each event; and
   association means for associating the event records with the nodes so that each of the event records is associated with the one of the nodes corresponding to the event time at which the respective event is scheduled to occur,
   wherein:
      the record generation means comprises means for generating a new event record for a new event; and
      the association means comprises means for associating the new event record with a node of the sorted tree data structure that corresponds to an event time at which the new event is scheduled to occur,
   wherein the tree generator means further comprises:
   means for determining whether a node of the sorted tree data structure exists that corresponds to the event time at which the new event is scheduled to occur; and
   means for generating the node corresponding to the event time at which the new event is scheduled to occur when no node exists that corresponds to the event time at which the new event is scheduled to occur, and
   wherein the association means further comprises:
   means for generating a linked list comprising the new event record and for associating the linked list with the node corresponding to the event time at which the new event is scheduled to occur when no node exists that corresponds to the event time at which the new event is scheduled to occur.

6. The apparatus of claim 5, wherein the sorted tree data structure is a binary sorted tree data structure.

7. The apparatus of claim 5, further comprising:
execution means for executing the simulation, wherein the execution means further comprises
means for deleting an event record for one of the events; and
means for simulating the one of the events.

8. The apparatus of claim 7, wherein the execution means further comprises:
means for deleting the node that corresponds to the event time at which the one of the events is scheduled to occur when no others of the events are scheduled to occur at that event time.

9. A computerized method for managing an event queue for a simulation comprising a plurality of events each scheduled to occur at one of a plurality of event times, the method comprising:
generating a sorted tree data structure comprising a plurality of nodes, wherein each of the nodes in the sorted tree data structure corresponds to only one of the event times associated with the events scheduled to occur, and wherein the nodes of the sorted tree data structure are sorted according to the event times of the nodes;
generating an event record for each event;
associating the event records with the nodes so that each of the event records is associated with the node corresponding to the event time at which the respective event is scheduled to occur;
adding a new event to the event queue, comprising:
generating a new event record for the new event; and
associating the new event record with a node of the sorted tree data structure that corresponds to a event time at which the new event is scheduled to occur;
determining whether a node of the sorted tree data structure exists that corresponds to the event time at which the new event is scheduled to occur;
generating the node corresponding to the event time at which the new event is scheduled to occur when no node exists that corresponds to the event time at which the new event is scheduled to occur; and
when no node exists that corresponds to the event time at which the new event is scheduled to occur:
generating a linked list comprising the new event record; and
associating the linked list with the node corresponding to the event time at which the new event is scheduled to occur.

10. The method of claim 9, wherein the sorted tree data structure is a binary sorted tree data structure.

11. The method of claim 9, further comprising:
executing the simulation, comprising
deleting the event record for one of the events; and
simulating the one of the events.

12. The method of claim 11, wherein executing the simulation further comprises:
deleting the node that corresponds to the event time at which the one of the events is scheduled to occur when no others of the events are scheduled to occur at that event time.

13. Computer-readable media storing instructions executable by a computer to perform a method for managing an event queue for a simulation comprising a plurality of events each scheduled to occur at one of a plurality of event times, the method comprising:
generating a sorted tree data structure comprising a plurality of nodes, wherein each of the nodes in the sorted tree data structure corresponds to only one of the event times associated with the events scheduled to occur, and wherein the nodes of the sorted tree data structure are sorted according to the event times of the nodes;
generating an event record for each event;
associating the event records with the nodes so that each of the event records is associated with the node corresponding to the event time at which the respective event is scheduled to occur;
adding a new event to the event queue, comprising:
generating a new event record for the new event; and
associating the new event record with a node of the sorted tree data structure that corresponds to a event time at which the new event is scheduled to occur;
determining whether a node of the sorted tree data structure exists that corresponds to the event time at which the new event is scheduled to occur;
generating the node corresponding to the event time at which the new event is scheduled to occur when no node exists that corresponds to the event time at which the new event is scheduled to occur; and
when no node exists that corresponds to the event time at which the new event is scheduled to occur:
generating a linked list comprising the new event record; and
associating the linked list with the node corresponding to the event time at which the new event is scheduled to occur.

14. The media of claim 13, wherein the sorted tree data structure is a binary sorted tree data structure.

15. The media of claim 13, wherein the method further comprises:
executing the simulation, comprising
deleting the event record for one of the events; and
simulating the one of the events.

16. The media of claim 15, wherein executing the simulation further comprises:
deleting the node that corresponds to the event time at which the one of the events is scheduled to occur when no others of the events are scheduled to occur at that event time.

* * * * *

UNITED STATES PATENT AND TRADEMARK OFFICE
CERTIFICATE OF CORRECTION

PATENT NO. : 7,562,367 B1  Page 1 of 1
APPLICATION NO. : 10/411838
DATED : July 14, 2009
INVENTOR(S) : Nir Arad It is certified that error appears in the above-identified patent and that said Letters Patent is hereby corrected as shown below:

On the Title Page Item (56)    Under "Other Publications", delete the third reference "Brown et al."

Signed and Sealed this

First Day of September, 2009

David J. Kappos
*Director of the United States Patent and Trademark Office*